United States Patent
Brindani et al.

(10) Patent No.: US 6,263,782 B1
(45) Date of Patent: Jul. 24, 2001

(54) DEVICE FOR SENSING THE PRESENCE OF PANS AND THE LIKE ON COOKING APPLIANCES

(75) Inventors: Franco Brindani, Casciago; Luca Frasnetti, Cunardo, both of (IT)

(73) Assignee: Whirlpool Corporation, Benton Harbor, MI (US)

( * ) Notice: Subject to any disclaimer, the term of this patent is extended or adjusted under 35 U.S.C. 154(b) by 0 days.

(21) Appl. No.: 09/734,302

(22) Filed: Dec. 11, 2000

(30) Foreign Application Priority Data

Dec. 24, 1999 (IT) ............................... MI99A2707

(51) Int. Cl.⁷ ................. A23L 1/00; A23L 3/00; A21B 1/00; F24C 3/00; A47J 27/26
(52) U.S. Cl. ................. 99/331; 99/337; 99/403; 219/449; 219/481; 219/494
(58) Field of Search ............................ 99/325–333, 337, 99/338, 344, 403, 452, 468, 485, 486, 492; 126/41 R, 39 E, 39 D, 20; 319/395–400, 445.1, 481, 449, 510, 458, 452, 494; 340/588, 589, 577, 578, 603; 431/1, 2, 6, 18, 114, 350, 78, 80

(56) References Cited

U.S. PATENT DOCUMENTS 3,851,640 * 12/1974 Keating et al. .................. 126/391
4,070,670 * 1/1978 Chen .................................. 99/344 X
4,671,250 * 6/1987 Hurley et al. ..................... 126/39 R
4,724,823 * 2/1988 Simpson ............................ 126/39 H
4,913,038 * 4/1990 Burkett et al. ................... 99/332 X
5,310,110 * 5/1994 Akamatsu et al. ................. 99/344
5,628,242 * 5/1997 Higley .............................. 99/332
5,856,654 * 1/1999 Frasnetti et al. .................. 219/481
6,087,944 * 7/2000 Santacatterina et al. ........... 340/588

FOREIGN PATENT DOCUMENTS

19700753 A  7/1998  (DE) .
2119931     11/1983 (GB) .
3820005      6/1974 (US) .

OTHER PUBLICATIONS

European Search Report EP 00 12 2404 Dated Jan. 30, 2001.

* cited by examiner

*Primary Examiner*—Timothy F. Simone
(74) *Attorney, Agent, or Firm*—Joel M. Van Winkle; Robert O. Rice; Thomas J. Roth

(57) ABSTRACT

A device for sensing the presence of cooking utensils on a cooking hob comprising at least one heat source. The device includes an electrically conductive coil turn fed by the signal generated by an oscillator. The oscillator is preferably a voltage-controlled oscillator generating square wave signals. The coil turn operates, when utensil sensing occurs, to modify the cut-off frequency of a low pass filter (L/R) fed by said oscillator (VCO).

15 Claims, 2 Drawing Sheets

DEVICE FOR SENSING THE PRESENCE OF PANS AND THE LIKE ON COOKING APPLIANCES

BACKGROUND OF THE INVENTION

1. Field of the Invention

This invention relates to a device for sensing the presence of at least one at least partly metal cooking utensil (pan, pot, casserole etc.) positioned on a preferably electrical heat source of a cooking appliance (hot-plate, cooking hob, cooker etc.) in accordance with the introduction to the accompanying claim 1.

2. Description of the Related Art

EP-A1-0553425 describes a method and device for sensing the presence of a cooking utensil positioned on a glass ceramic cooking hob above a usual heat source, for example electrical. Between this source and the glass ceramic surface there is positioned a wire resistor of open ring configuration.

After positioning the cooking utensil a variation occurs in the characteristics of the wire resistor of open ring configuration and hence of the electrical signal flowing through the resistor.

The known device has not proved sufficiently reliable in the sense that under certain operating conditions spurious signals occur which give a false indication of the presence and/or absence of the cooking utensil.

SUMMARY OF THE INVENTION

The main object of this invention is to provide a device for sensing the presence of cooking utensils which is based on different concepts and which besides being reliable is also more advantageous cost-wise.

According to the present invention, the foregoing and other objects are attained by a device for sensing the presence of cooking utensils on a cooking hob comprising at least one heat source. The device includes an electrically conductive coil turn fed by the signal generated by an oscillator. The oscillator is preferably a voltage-controlled oscillator generating square wave signals. The coil turn operates, when utensil sensing occurs, to modify the cut-off frequency of a low pass filter (L/R) fed by said oscillator (VCO).

This and further objects which will be more apparent from the detailed description given hereinafter are attained by a sensing device in accordance with the teachings of the accompanying claims.

BRIEF DESCRIPTION OF THE DRAWINGS

The invention will be more apparent from the ensuing detailed description given by way of non-limiting example with reference to the accompanying drawings, on which.

DESCRIPTION OF THE PREFERRED EMBODIMENT

With reference to the figures, the glass ceramic cooking hob 1 comprises a conventional glass ceramic plate 2 on which a cooking utensil P (for example a metal pan) is to be rested.

Figure 1:
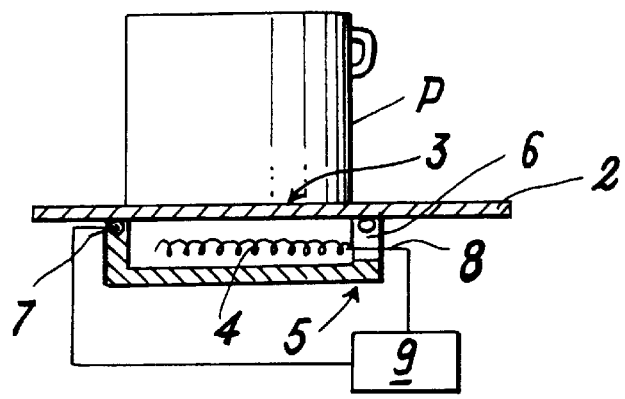
FIG. 1 is a schematic view of the device of the invention.
Figure 2:
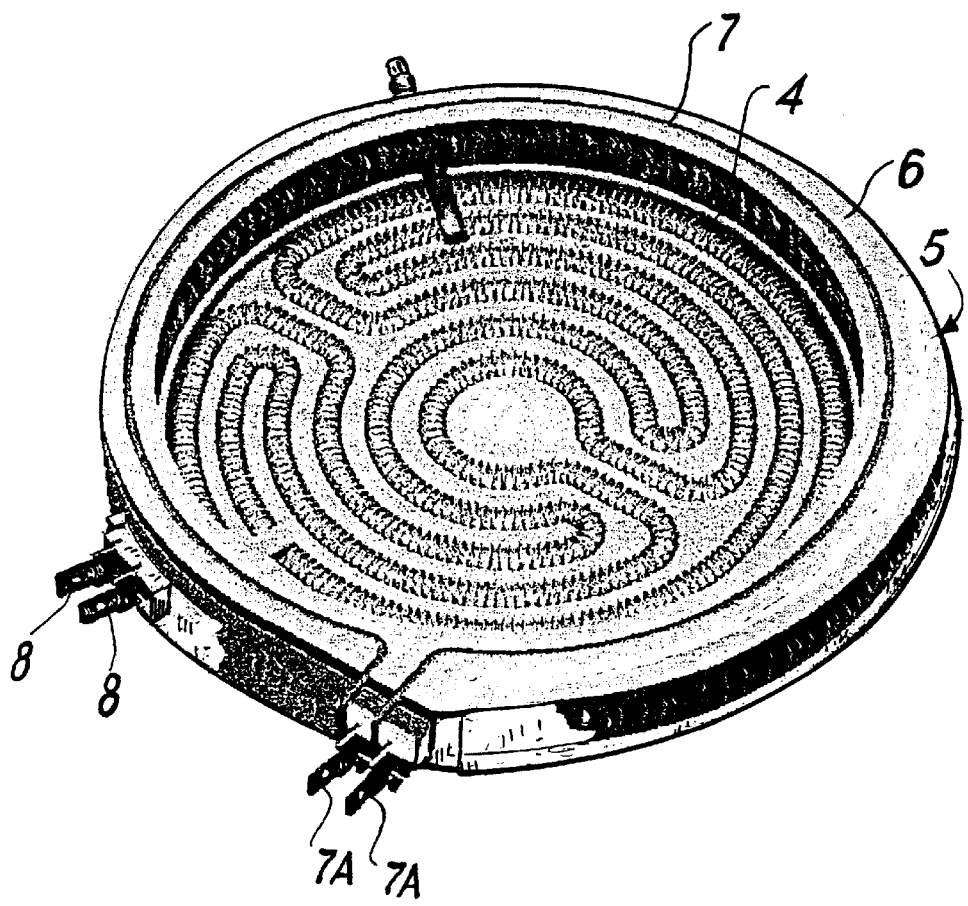
FIG. 2 is a perspective view of a heat source in the form of an electrical resistance element, and the relative coil turn for sensing the presence or absence of the cooking utensil.

The pan P is rested on a cooking region 3 comprising an electrical heat source consisting, for example, of a conventional resistance element 4 (or other equivalent heating element) which, as can be seen in FIG. 2, is positioned in a container 5 for example of insulating material, glass fibre or the like, open upwards towards the lower face of the glass ceramic plate with which it is in contact. The container 5 has a perimetral wall 6 comprising a substantially annular groove housing a coil turn 7 of conducting metal. The ends of the turn terminate in terminals 7, the ends of the heating element 4 terminating in terminals 8.

The heating element 4 is connected via its terminals 8 to a control circuit 9 to which the turn 7 is also connected.

In its sensing part concerning the invention, the control circuit 9 comprises a voltage-controlled oscillator indicated by VCO, which generates a square wave signal with a frequency, for example, of 1 MHz. The square wave signal is applied to the input of a low pass filter L/R the inductance L1 of which forms part of the turn 7, and an impedance adapter X. However in the limit, using a suitable VCO the turn could be sufficient alone. The filter output signal, which differs depending on whether the pan P is or is not positioned on the heat source (resistance element 4), is applied to a peak rectifier DS1 which transforms the signal leaving the filter into a continuous signal, this enabling the highest possible effective value to be obtained. The signal leaving the peak rectifier DS1 is applied to the inverting input of an operational amplifier LM (feedback via the resistor R19), to its non-inverting input there being applied the non-filtered square wave signal transformed into a continuous signal by a peak rectifier DS2 identical to the said peak rectifier DS1.

The action of the amplifier is such that its output signal is different according to whether the presence of the pan P is sensed or not sensed by the turn 7.

If the pan is absent, the signal leaving the operational amplifier LM can be used by the remaining electronic circuit 9 in such a manner as to not allow the resistance heating element 4 to be powered even if the operator wishes to switch on the resistance element 4 by operating a conventional knob. It will however be switched on if, having positioned the pan P on the correct point of the cooking hob, the signal leaving the operational amplifier LM enables powering of the resistance element. Removing the pan results in automatic switch-off of the resistance heating element.

As is apparent, the invention is based on variation in the cut-off frequency of a low pass filter L/R due to the change in the value of L which occurs on resting the pan P on or removing it from the glass ceramic surface.

Figure 3:
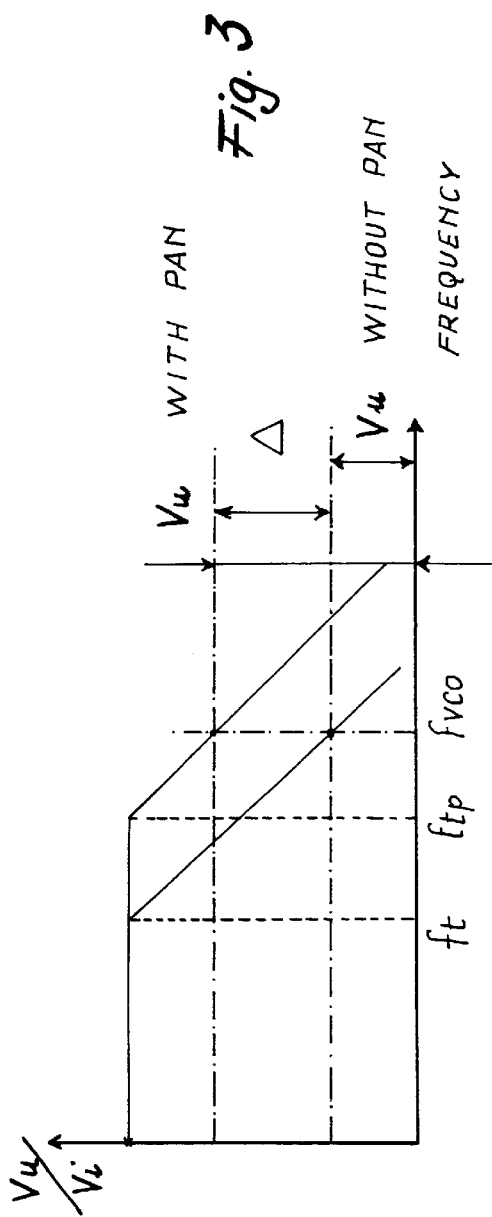
FIG. 3 is a graph showing the variation in the ratio Vu/Vi (Vu=output voltage and Vi=input voltage) of the low pass filter against frequency with the cooking utensil respectively absent and present on the heat source.

With reference to FIG. 3, in which the horizontal axis indicates frequency and the vertical axis indicates the ratio Vu/Vi, i.e. the alternation (output voltage=Vu, input voltage=Vi of the L/R filter), if the pan is absent the filter cut-off frequency is ft, whereas if the pan is present the cut-off frequency assumes the higher value ftp.

At the oscillator frequency fvco there is, in the absence of the pan, a value Vu for the same Vi which is substantially lower than that with the pan, and hence a variation Δ which is utilized to obtain the control signal, for example for the aforesaid control in switching-on the resistance heating element or another equivalent heating element.

As already stated, according to the invention the turn 7 is fed with a square wave signal, for example of 1 MHz frequency, by a voltage-controlled oscillator VCO. This, given the high harmonics content of this particular wave form, allows maximization of the variation in the filter output signal Vu when the pan is rested on the plate. It should be noted that a square wave oscillator is easy to form using a few simple components, as is apparent from FIG. 4 and from the ensuing analytical description.

The use of the peak rectifier (DS1 and DS2) both at the output of the L/R filter and in the comparison branch to the non-inverting input of the amplifier LM enables a signal to be obtained having the highest possible effective value, and hence very easily handled.

The use of a voltage-controlled oscillator enables the cut-off frequency of the L/R filter to be automatically found, hence enabling the circuit to be adapted to the variabilities introduced by the various sensor components (coil turn, impedance adapter, etc.), which vary from circuit to circuit. The impedance adapter X enables a relatively low VCO frequency to be used. In actual fact, the very low inductance of the coil turn 7 means that the VCO frequency should be greater than 1 MHz.

However, with this adapter the value of L "seen" by the circuit is L', which is directly proportional to $N^2$ (where N is the primary to secondary turn ratio, i.e. $N=n_1/n_2$. If N is 40/1, $N^2=1600$, hence L'=1600L. This correspondingly reduces the cut-off frequency which in an L/R filter is given by ft'=R/($2\pi$L').

Moreover, a single VCO oscillator is able to handle a large number of sensor turns 7 (i.e. a large number of resistance heating elements) by selectively injecting the signal of one and the same VCO oscillator into the various filters of one and the same cooking hob, with multiplexing of the various sensors 7. This enables substantial technical advantages to be obtained deriving from the fact that having only one oscillator obviates component tolerances, and also results in cost advantages because of the reduction in the number of components.

Again, using a voltage-controlled oscillator means that its oscillation frequency can be changed by replacing the fixed voltage source (indicated by V1 in FIG. 4) with a variable voltage source, for example by using a PMW (pulse width modulation) source so as to adapt the cut-off frequency to the specific components of the circuit.

Figure 4:
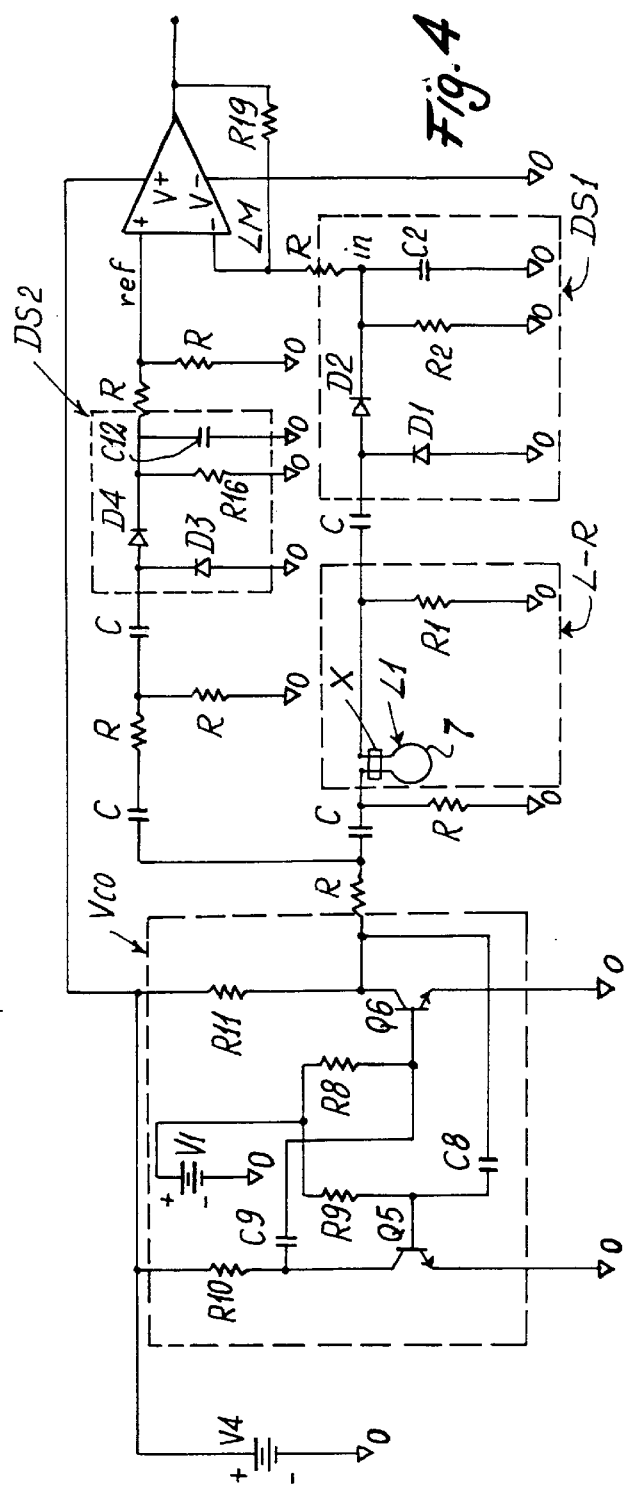
FIG. 4 shows the electrical circuit of the device of the invention.

In detail, the circuit of FIG. 4 comprises a d.c. power supply source represented by a battery V4, the VCO oscillator voltage-controlled by the source V1, a first circuit branch comprising the coil turn 7 of the low pass filter L/R, the peak rectifier DS1, and the feedback connected amplifier LM, of which the inverting input is connected to said first circuit branch and the non-inverting input is connected to a second circuit branch connected to the output of the VCO oscillator.

The VCO oscillator (of usual type) comprises two identical transistors Q5 and Q6 connected between the battery V4 and earth via resistors R10 and R11 (not necessarily identical). The transistor bases are connected to the source V1 via identical resistors R8, R9, the collector of one being connected to the base of the other via capacitors C8, C9 (not necessarily identical).

The L/R filter comprises the inductance L1 and the resistor R1.

The peak rectifiers DS1 and DS2 comprise respectively the diodes D1. D2 and D3, D4, the resistors $R_2$, $R_{16}$, and the capacitors $C_2$, $C_{12}$.

The other not specifically described components (resistors R and capacitors C) are provided for circuit calibration, filtration, protection and signal level optimization purposes.

We claim:

1. A device for sensing the presence of cooking utensil on a cooking hob having at least one heat source positioned below a support surface for supporting the cooking utensil, said device comprising:

a voltage-controlled oscillator generating a square wave signal;

an electrically conductive coil turn positioned for sensing the presence of the utensil, the conductive coil fed by the square wave signal generated by the voltage-controlled oscillator, said conductive coil turn forming a low pass filter (L/R) wherein the filter output signal differs in response to the presense or absense of a cooking utensil on the support surface.

2. A device as claimed in claim 1, wherein the conductive coil acts to modify the cut-off frequency of the low pass filter (L/R) when said sensing occurs.

3. A device as claimed in claim 1, wherein the filter is an LR filter.

4. A device as claimed in claim 1, wherein the impedance of the low pass filter comprises an impedance adapter (X) and the said coil turn.

5. A device as claimed in claim 1, wherein an operational amplifier (LM) is provided, in which one input is connected to the output of the low pass filter (L/R) via a peak rectifier (DS1), the other input being connected to the voltage-controlled oscillator (VCO) via a further peak rectifier (DS2).

6. A device as claimed in claim 5, wherein the output of the operational amplifier (LM) is used for controlling the heat source or sources.

7. A device as claimed in claim 1, wherein the coil turn is directly connected to the voltage-controlled oscillator (VCO).

8. A device as claimed in claim 1, wherein the output of the operational amplifier (LM) is used by a microprocessor for controlling its oscillation frequency.

9. A device as claimed in claim 1, wherein a single oscillator (VCO) is used with electronic selection for controlling several low pass filters (L/R), each associated with a different heat source.

10. A device as claimed in claim 9, wherein the electronic selection comprises multiplexing.

11. A cooking appliance, comprising:

a support surface for supporting a cooking utensil to be heated, the support surface having a lower face;

at least one heat source positioned below the support surface;

a container supporting the heat source below the support surface, the container having a perimetral wall in contact with the lower face of the support surface;

a conductive coil turn supported within the perimetral wall of the housing adjacent the lower face of the support surface;

a voltage-controlled oscillator generating a square wave signal;

wherein the conductive coil is fed by the square wave signal generated by the voltage-controlled oscillator, the conductive coil turn forming a low pass filter (L/R) wherein the filter output signal differs in response to the presense or absense of a cooking utensil on the support surface.

12. A cooking appliance as claimed in claim 11, wherein the conductive coil acts to modify the cut-off frequency of the low pass filter (L/R) when said sensing occurs.

13. A cooking appliance as claimed in claim 11, wherein the filter is an LR filter.

14. A cooking appliance as claimed in claim 11, wherein the impedance of the low pass filter comprises an impedance adapter (X) and the said coil turn.

15. A cooking appliance as claimed in claim 11, wherein an operational amplifier (LM) is provided, in which one input is connected to the output of the low pass filter (L/R) via a peak rectifier (DS1), the other input being connected to the voltage-controlled oscillator (VCO) via a further peak rectifier (DS2).

* * * * *